United States Patent
Terui

(10) Patent No.: US 7,482,202 B2
(45) Date of Patent: Jan. 27, 2009

(54) SEMICONDUCTOR DEVICE INCLUDING A PLURALITY OF CIRCUIT ELEMENT CHIPS AND A MANUFACTURING METHOD THEREOF

(75) Inventor: Makoto Terui, Yamanashi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/947,335

(22) Filed: Nov. 29, 2007

(65) Prior Publication Data

US 2008/0090330 A1   Apr. 17, 2008

Related U.S. Application Data

(62) Division of application No. 11/129,328, filed on May 16, 2005, now Pat. No. 7,321,163.

(30) Foreign Application Priority Data

May 19, 2004   (JP)   ............................. 2004-148496

(51) Int. Cl.
*H01L 21/44* (2006.01)
*H01L 21/48* (2006.01)
*H01L 21/50* (2006.01)

(52) U.S. Cl. ................ 438/109; 438/112; 257/E21.499

(58) Field of Classification Search ................ 438/106, 438/109, 112, 124, 127; 257/E21.499
See application file for complete search history.

(56) References Cited

U.S. PATENT DOCUMENTS

| 6,661,939 | B2 | 12/2003 | Kaneko et al. |
| 6,992,398 | B2 | 1/2006 | Farnworth |
| 7,235,885 | B2 * | 6/2007 | Horii .......................... 257/777 |

FOREIGN PATENT DOCUMENTS

| JP | 2001257310 | 9/2001 |
| JP | 2002299496 | 10/2002 |
| JP | 2004056093 | 2/2004 |

* cited by examiner

*Primary Examiner*—Hoai V Pham
(74) *Attorney, Agent, or Firm*—Volentine & Whitt, P.L.L.C.

(57) ABSTRACT

A semiconductor device includes a first circuit element chip including a first surface on which a plurality of first electrodes are arranged, and a second circuit element chip including a first surface on which a plurality of second electrodes are arranged. The second circuit element chip is mounted on the first circuit element chip. The semiconductor device further includes an insulating film disposed on a side surface of the second circuit element chip and disposed between the first surfaces of the first and second circuit element chips. The semiconductor device still further includes a resin layer covering the second circuit element chip and the insulating film. Also, there is provided a manufacturing method of the semiconductor device which includes forming the insulating film after the second circuit element chip is mounted on the first circuit element chip.

5 Claims, 5 Drawing Sheets

SEMICONDUCTOR DEVICE INCLUDING A PLURALITY OF CIRCUIT ELEMENT CHIPS AND A MANUFACTURING METHOD THEREOF

CROSS-REFERENCE TO RELATED APPLICATIONS

This is a divisional application of application Ser. No. 11/129,328, filed on May 16, 2005, now U.S. Pat. No. 7,321,163 which is hereby incorporated by reference in its entirety for all purposes.

BACKGROUND OF THE INVENTION

1. Field of the Invention

The present invention relates to a semiconductor device and a manufacturing method of the semiconductor device, in particular, to a semiconductor device which includes a plurality of circuit element chips and a manufacturing method of the semiconductor device. This is a counterpart of and claims priority to Japanese Patent Application No. 2004-148496 filed on May 19, 2004, which is herein incorporated by reference.

2. Description of the Related Art

Along with a request for miniaturization of electronics devices in recent years, research and development for various methods of high-density packaging of semiconductor devices have been prompted. The methods include a packaging technology of miniaturization of the semiconductor devices per se and a packaging technology of high-density packaging of a plurality of circuit element chips in the semiconductor device. Furthermore, the packaging technology of miniaturization of the semiconductor devices per se includes a technology of a chip size package (hereinafter referred as to a "CSP") which has almost same outline size as a size of a semiconductor chip. These technologies are described in a Patent Document 1 (Japanese Patent Publication Laid-open No. 2001-257310), a Patent Document 2 (Japanese Patent Publication Laid-open No. 2002-299496) and a Patent Document 3 (Japanese Patent Publication Laid-open No. 2004-56093).

However, in the packaging technologies of the above-described Patent Documents 1 and 2, when the semiconductor chip is sealed with a molding resin, the semiconductor chip mounted on a desired location directly receives a fluid pressure of the molding resin. On such an occasion as this, the semiconductor chip may move out of the desired location, and then a yield rate in the manufacturing method of the semiconductor devices may decrease. Also, the packaging technology of the Patent Document 3 requires complicated processes and a position adjustment of the semiconductor chip with a high degree of accuracy, and then, it is not easy to meet those requirements.

SUMMARY OF THE INVENTION

An object of the present invention is to provide a semiconductor device, including a plurality of circuit element chips, which possesses higher reliability in its operation with the miniaturization by the CSP technology realized, and to provide a manufacturing method of the semiconductor device in which the yield rate is higher.

According to an aspect of the present invention, for achieving the above-mentioned object there is provided a semiconductor device which includes a first circuit element chip including a first surface on which a plurality of first electrodes are arranged, and a second circuit element chip including a first surface on which a plurality of second electrodes are arranged. The second circuit element chip is mounted on the first circuit element chip so that the first surface of the first circuit element chip faces the first surface of the second circuit element chip. The semiconductor device further includes an insulating film disposed on a side surface of the second circuit element chip. The insulating film is disposed between the first surfaces of the first and second circuit element chips, so that a gap between the first circuit element chip and the second circuit element chip is filled with the insulating film. The semiconductor device still further includes a resin layer which covers the second circuit element chip and the insulating film.

According to another aspect of the present invention, for achieving the above-mentioned object, there is provided a semiconductor device which includes a wafer including a plurality of circuit element regions on which a plurality of first electrodes are respectively arranged, and a plurality of circuit element chips each of which includes a first surface on which a plurality of second electrodes are arranged The circuit element chips are mounted on the wafer so that the first surfaces of the circuit element chips face the circuit element regions of the wafer. The semiconductor device further includes an insulating film disposed on side surfaces of the circuit element chips. The insulating film is disposed between the circuit element regions of the wafer and the first surfaces of the circuit element chips so that gaps between the wafer and the circuit element chips are filled with the insulating film. The semiconductor device still further includes a resin layer which covers the circuit element chips and the insulating film.

According to the other aspect of the present invention, for achieving the above-mentioned object, there is provided a manufacturing method of a semiconductor device. In the manufacturing method, a substrate which includes a circuit element region and a circuit element chip which includes a first surface are provided. The circuit element region includes a plurality of first electrodes formed on the circuit element region. The first surface of the circuit element chip includes a plurality of second electrodes formed on the first surface of the circuit element chip. In the manufacturing method, the circuit element chip is mounted on the circuit element region of the substrate with a gap between the circuit element chip and the circuit element region. The first surface of the circuit element chip faces the circuit element region. Furthermore, in the manufacturing method, an insulating film is formed between the substrate and the circuit element chip after the circuit element chip is mounted on the circuit element region, so that the gap between the substrate and the circuit element chip is filled with the insulating film. Still furthermore, in the manufacturing method, a resin layer is formed to cover the substrate, the circuit element chip and the insulating film.

The above and further aspects and novel features of the invention will more fully appear from the following detailed description, appended claims and the accompanying drawings.

DETAILED DESCRIPTION OF THE PREFERRED EMBODIMENTS

Embodiments of the present invention will be described hereinafter with reference to the accompanying drawings. The drawings used for this description illustrate major characteristic parts of embodiments in order that the present invention will be easily understood. However, the invention is not limited by these drawings.

Figure 1:
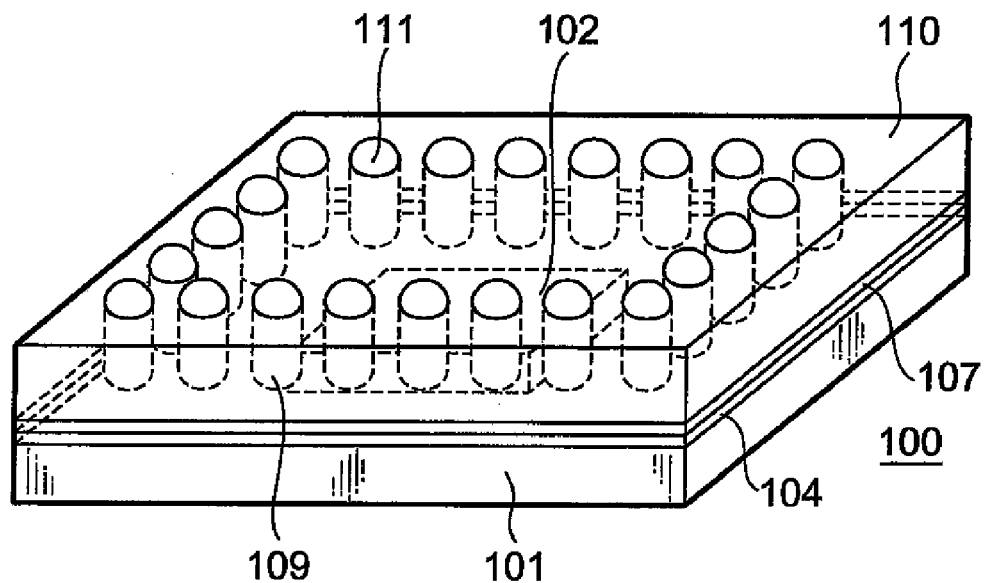
FIG. 1 is a perspective view of a semiconductor device according to a first preferred embodiment of the present invention.
Figure 2:
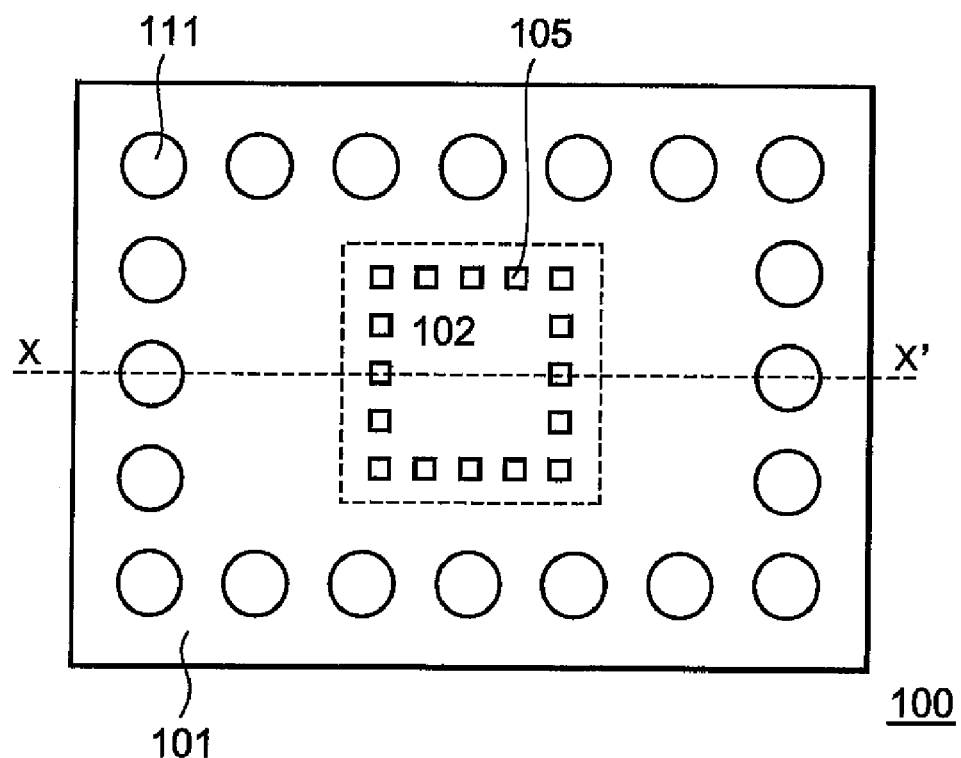
FIG. 2 is a top plan view for describing the semiconductor device in FIG. 1.
Figure 3A:
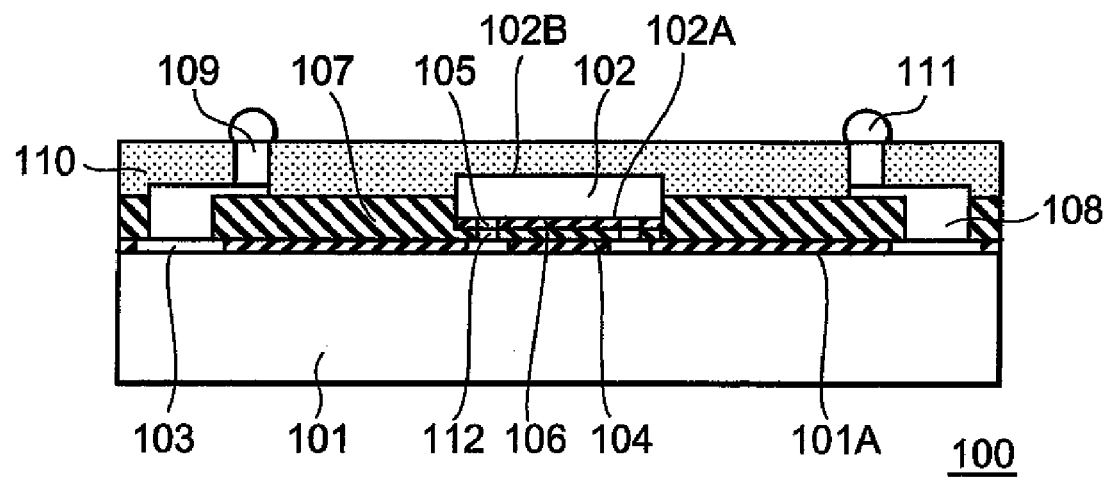
FIG. 3A is a cross-sectional view for describing the semiconductor device along a dashed-line X-X' in FIG. 2.

FIG. 1 is a perspective view of a semiconductor device 100 according to a first preferred embodiment of the present invention. FIG. 2 is a top plan view for describing the semiconductor device 100 in FIG. 1. FIG. 3A is a cross-sectional view for describing the semiconductor device 100 along a dashed-line X-X' in FIG. 2.

As shown in FIGS. 1 through 3A, the semiconductor device 100 includes a first circuit element chip 101 and a second circuit element chip 102 which is mounted on the first circuit element chip 101. The first circuit element chip 101 includes a first surface 101A in which a first circuitry has been formed. In this example, for example, the first circuit element is a semiconductor integrated circuit. The first circuit element chip 101 includes a plurality of first electrodes 103 which are disposed on the first surface 101A. The first electrodes 103 are arranged along a periphery of the first circuit element chip 101 and in a predetermined mounting region on which the second element chip 102 is mounted. The first surface 101A is covered by a first protective film 104 while the first electrodes 103 are exposed from the first protective film 104. In this example, the first protective film 104 is a silicon oxide film or a silicon nitride film and has a thickness of approximately 1 µm.

The second circuit element chip 102 includes a first surface 102A in which a second circuitry has been formed. The second circuit element chip 102 includes a plurality of second electrodes 105 which are disposed on the first surface 102A. The second electrodes 105 are arranged along a periphery of the second circuit element chip 102. Furthermore, the second electrodes 105 are arranged on the first surface 102A so as to correspond to the first electrodes 103 which are arranged in the predetermined mounting region on which the second element chip 102 is mounted. The first surface 102A is covered by a second protective film 106 while the second electrodes 105 are exposed from the second protective film 106. In this example, the second protective film 106 is a silicon oxide film or a silicon nitride film and has a thickness of approximately 1 µm.

The second circuit element chip 102 is mounted on the first circuit element chip 101 so that the first surface 102A of the second circuit element chip 102 faces the first surface 101A of the first circuit element chip 101 and so that the second protective film 106 is isolated from the first protective film 104. That is, the second circuit element chip 102 is mounted on the first circuit element chip 101 by a flip chip mounting method so as to configure a gap between the first protective film 104 and the second protective film 106. Also, the second circuit element chip 102 may be mounted on the first circuit element chip 101 so that the second circuitry functions as a portion of the first circuitry. The first electrodes 103 in the above-described predetermined mounting region are electrically coupled to the second electrodes 105 through adhesive members 112 such as aurous bumps. In addition, a width of the second circuit element chip 102 is smaller than a width of the first circuit element chip 101, and a thickness of the second circuit element chip 102 is designed so that the second circuit element chip 102 is incorporated in the semiconductor device 100. In this example, a thickness of the second circuit element chip 102 is approximately 300 µm and the thickness of the second circuit element chip 102 is approximately 50 µm.

Furthermore, the semiconductor device 100 has an insulating film 107 disposed on the first surface 101A of the first circuit element chip 101 so as to cover the first protective film 104 except the first electrodes 103. The insulating film 107 also covers side surfaces of the second circuit element chip 102 and the second protective film 106. The gap between the first protective film 104 and the second protective film 106, that is, the gap between the first circuit element chip 101 and the second circuit element chip 102 is filled with the insulating film 107. A height of an upper surface of the insulating film 107 from the first front surface 101A is lower than a height of a second surface 102B of the second circuit element chip 102 opposite to the first surface 102A from the first surface 101A of the first circuit element chip 101. The insulating film 107 includes a polymeric resin, for example, a polyimide resin. Alternatively, the insulating film 107 may include poly benzo-oxazole (hereinafter referred to as the PBO). The insulating film 107 which includes the polyimide resin or the PBO may function as an adhesive film. In this example, the insulating film 107 has a thickness of approximately 4 µm.

A plurality of conductive wiring members 108 are disposed on the insulating film 107 so as to be electrically coupled to the first electrodes 103 disposed along the periphery of the first circuit element chip 101. The conductive wiring members 108 are arranged on the insulating film 107 so as to extend from the periphery of the first surface 101A toward an inside of the first front surface 101A of the first circuit element chip 101. In this example, each of the conductive wiring members 108 is a composition member that may consist of a titanium layer and a copper layer which is disposed on the titanium layer. The titanium layer has a higher adhesiveness with the first electrodes 103 and the insulating film 107. The titanium layer may have a higher adhesiveness with the first protective film 104 when the conductive wiring members 108 are disposed on the first protective film 104. Also, the titanium layer suppresses the copper atomic elements of the copper layer from diffusing toward the first electrodes 103 and the insulating film 107. Furthermore, the titanium is disposed between the first electrode 103 and the copper layer so that the copper layer is formed over the first electrode 103 by a plating technology. The copper layer principally causes a higher electrical conduction in the conductive wiring members 108. Each of the conductive wiring members 108 may be a monolayer. In addition, each of the conductive wiring members 108 may be a composition member that may consist of a chromium layer and a copper layer, a chromium layer and an aurous layer, a nickel layer and a copper layer, a nickel layer and an aurous layer, a titanium layer and a copper layer, a titanium layer and an aurous layer, a tungsten layer and a copper layer, or a tungsten layer and an aurous layer.

Figure 3B:
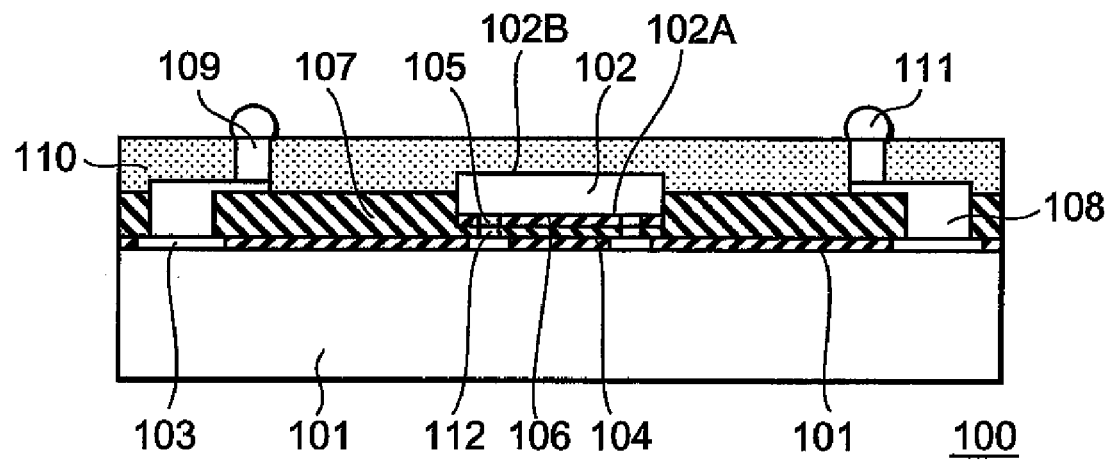
FIG. 3B is a cross-sectional view for describing another semiconductor device according to the first preferred embodiment of the present invention.

A plurality of conductive post members 109 are disposed on the conductive wiring members 108 so as to be electrically coupled to the conductive wiring members 108. The conductive post members 109 may include lower electrical resistance such as copper, aurum or aluminum. A resin layer 110 is disposed on the insulating film 107 so as to cover the second circuit element chip 102, the conductive wiring members 108 and side surfaces of the conductive post members 109. Alternatively, the resin layer 110 may be disposed on the insulating film 107 so as to expose the second surface 102B of the second circuit element chip 102, as shown in FIG. 3B. The resin layer 110 has a thickness of approximately 100 µm. The resin layer 110 has an outline which is the same as an outline of the first circuit element chip 101. A plurality of external electrodes 111 are disposed on the resin layer so as to be electrically coupled to the conductive post members 109. That is, the first electrodes 103 are electrically coupled to the external electrodes 111 through the conductive wiring members 108 and the conductive post members 109. Also, the second electrodes 105 may be electrically coupled to the external electrodes 111 through the first electrodes 103, the conductive wiring members 108 and the conductive post members 109. The semiconductor device 100 is mounted on an external printed circuit board so as to be electrically coupled to the external printed circuit board through the external electrodes 111. That is, the first circuitry is electrically coupled to the external printed circuit board through the first electrodes 103, the conductive wiring members 108, the conductive post members 109 and the external electrodes 111.

The above-described semiconductor device 100 may have a plurality of second circuit element chips 102 in itself. In this example, the second circuit element chip 102 may be a passive element chip. The passive element chips are often used for digital circuits and analog circuits which include a decoupling capacitor, a pull-up resistance element, a pull-down resistance element, a choke inductor, and an inductor which functions as a portion of a frequency matching circuit or a filter circuit. In a mounting area of the electrical devices which constitute one system, a mounting area occupied by the passive element chips is exceeding 70%.

Figure 4:
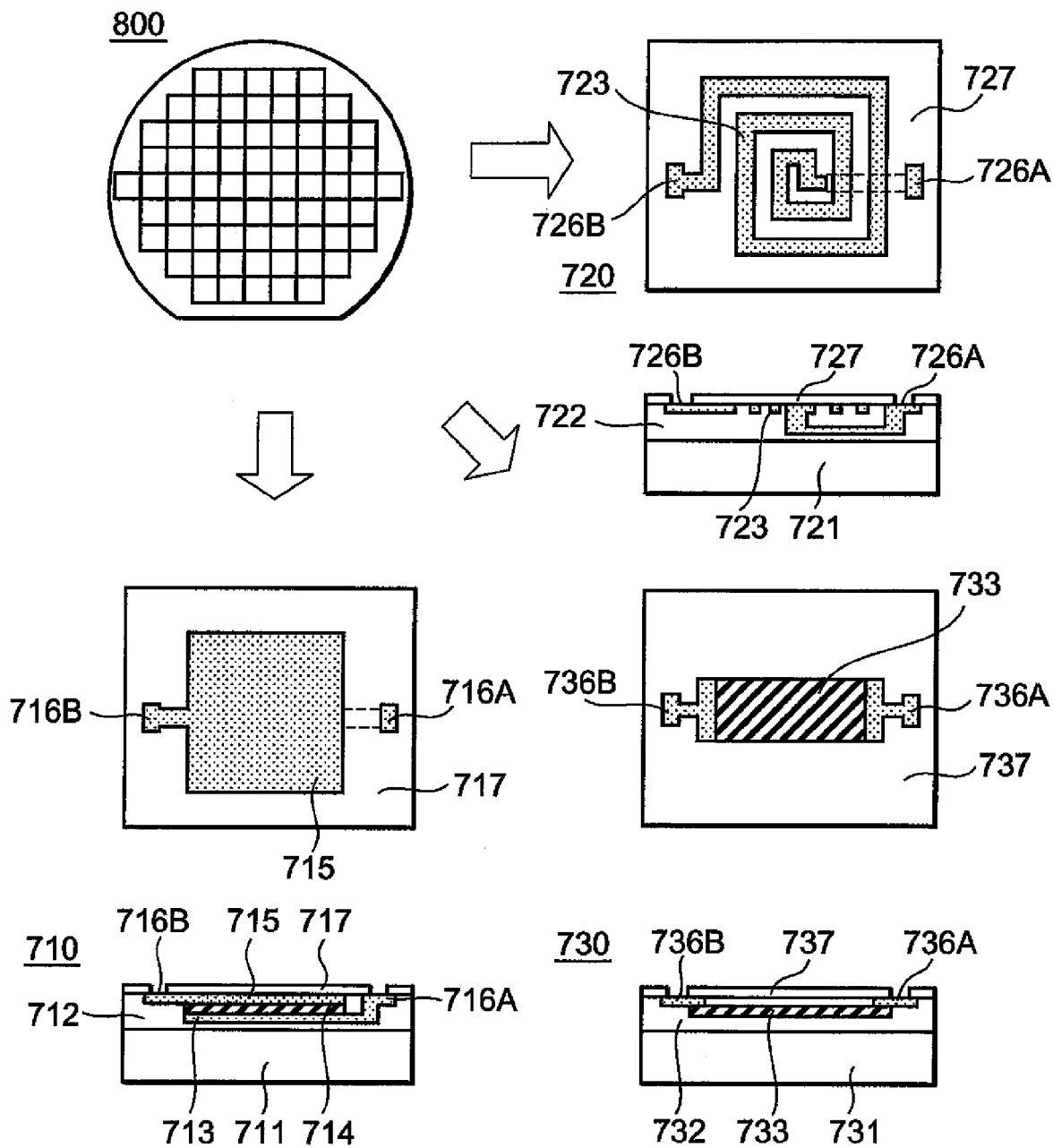
FIG. 4 is a plan view for describing the passive element chip according to the first preferred embodiment of the present invention.

FIG. 4 is a plan view for describing the passive element chip according to the first preferred embodiment of the present invention. A wafer 800 is divided into each of the passive element chips 710 through 730 by a dicing cutter. The passive element chip 710 has capacitance characteristics. The passive element chip 710 has a first electrode 713 disposed on a substrate 711 through an insulating layer 712. A second electrode 715 is disposed on the first electrode 713 through a dielectric film 714. The passive element chip 710 is covered with a protective film 717. A portion of the first electrode 713 is exposed from the protective film 717 as a first electrode pad 716A. Likewise, a portion of the second electrode 715 is exposed from the protective film 717 as a second electrode pad 716B.

The passive element 720 has inductance characteristics. The passive element chip 720 has a spiral wiring film 723 disposed on a substrate 721 through an insulating layer 722. The passive element chip 720 is covered with a protective film 727. Portions of the spiral wiring film 723 are exposed from the protective film 727 as a first electrode pad 726A and a second electrode pad 726B.

The passive element 730 has resistance characteristics. The passive element chip 730 has a conductive layer 733 disposed on a substrate 731 through an insulating layer 732. In this example, the conductive layer 733 includes ruthenium oxide. The passive element chip 730 is covered with a protective film 737. Portions of the conductive layer 733 are exposed from the protective film 737 as a first electrode pad 736A and a second electrode pad 736B.

Each of the above-described substrates 711, 721 and 731 is made of an insulating material such as glass, sapphire or semiconductor which includes high resistive silicon. Each of the above-described first and second electrodes 713 and 715, the spiral wiring film 723 and the conductive layer 733 is made of aluminum base alloy, copper base alloy or gold base alloy, using a Chemical Vapor Deposition method, an evaporation method or a sputtering method. The insulating layers 712, 722 and 732, the first and second electrodes 713 and 715, the spiral wiring film 723 and conductive layer 733 are formed into predetermined patterns by a photolithographic method and an etching method.

The passive element chip 710 may have a plurality of capacitance elements on a single chip. Likewise, the passive element chip 720 may have a plurality of inductance elements on a single chip and the passive element chip 730 may have a plurality of resistance elements on a single chip. Alternatively, a plurality of kinds of the capacitance elements, the inductance elements and the resistance elements may be formed on a single chip. Furthermore, both of the decoupling capacitor and the choke inductor may be formed on a single chip. Alternatively, both of the decoupling capacitor and the inductor as a portion of the frequency matching circuit or the filter circuit may be formed on a single chip. When the more passive element chips are formed on a single chip, an extra area may be decreased. That causes the miniaturization of the semiconductor device including those passive element chips. That is, a plurality of passive circuits are incorporated in one semiconductor device. For example, when the second circuit element chip 102 incorporates a plurality of noise-canceling capacitors, it eliminates the need for interconnections which couples external noise-canceling capacitors to the semiconductor device. That is, the semiconductor device which incorporates the noise-canceling capacitors may be realized with short internal wirings. As a result, parasitic inductance value of the internal wirings may be reduced in the semiconductor device.

The manufacturing method of a plurality of semiconductor devices such as the above-described semiconductor device 100 according to the first preferred embodiment of the present invention is described below. FIGS. 5A through 5E illustrate processes of manufacturing the semiconductor device according to the first preferred embodiment of the present invention.

Figure 5A:
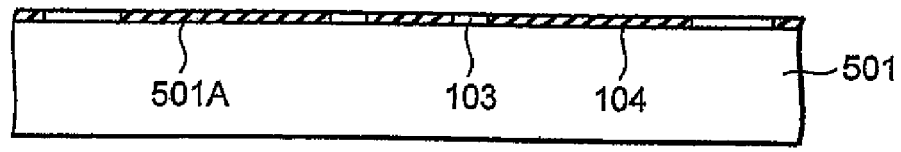
FIGS. 5A through 5E illustrate processes of manufacturing the semiconductor device according to the first preferred embodiment of the present invention.

First of all, as shown in FIG. 5A, a substrate 501 such as a semiconductor wafer is provided which includes a plurality of circuit element regions 501A and which is covered by a first protective film 104. Hereupon, a first circuitry such as a semiconductor integrated circuit has been formed in each of the circuit element regions 501A of the substrate 501, and a plurality of the first electrodes 103 have been disposed on each of the circuit element regions 501A. Also, a plurality of circuit element chips 102 are provided in which second circuitries and a plurality of second electrodes 105 have been formed. Hereupon, each of the circuit element chips 102 includes a second protective film 106 on a first surface 102A of the circuit element chips 102 except the second electrodes 105, while a plurality of aurous bumps 112 are disposed on the second electrodes 105. Alternatively, the substrate 501 which includes one of the circuit element regions 501A may be provided, and one of the circuit element chips 102 may be provided.

Figure 5B:
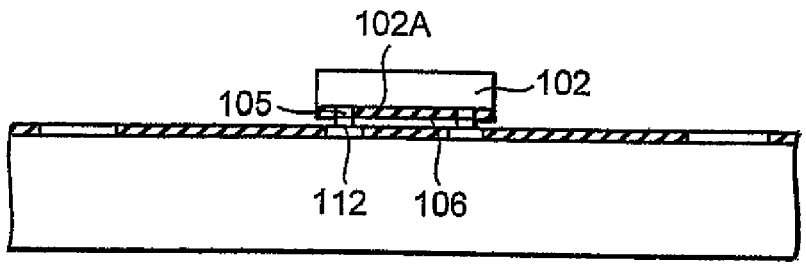

Next, as shown in FIG. 5B, each of the circuit element chips 102 is disposed on each of the circuit element regions 501A of the substrate 501 so that each of the first surfaces 102A of the circuit element chips 102 faces each of the circuit element regions 501A of the substrate 501. That is, the circuit element chips 102 are mounted on the substrate 501 by the flip chip mounting method so as to form gaps between the first protective film 104 and the second protective film 106. The second electrodes 105 of each of the circuit element chips 102 are electrically coupled to the first electrodes 103 of each of the circuit element regions 501A through the aurous bumps 112.

Figure 5C:
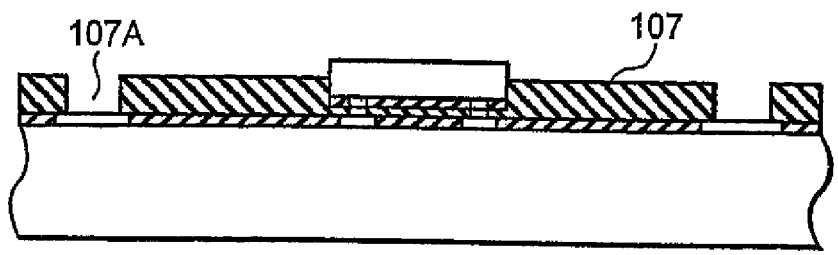

Then, as shown in FIG. 5C, an insulating film 107 is formed on the substrate 501 by a spin coat method so that the gaps between the first protective film 104 and the second protective films 106 are filled with the insulating film 107. That is, the insulating film 107 contacts both the first protective film 104 and the second protective films 106. Also, the side surfaces of each of the circuit element chips 102 and the first protective film 104 are covered with the insulating film 107. In this example, since the insulating film 107 includes a PBO or an polymeric resin such as a polyimide resin, each of the circuit element chips 102 is stably mounted on each of the circuit element regions 501A of the substrate 501. Also, a plurality of openings 107A are formed in the insulating film 107 so that the first electrodes 103 are exposed from the insulating film 107.

Figure 5D:
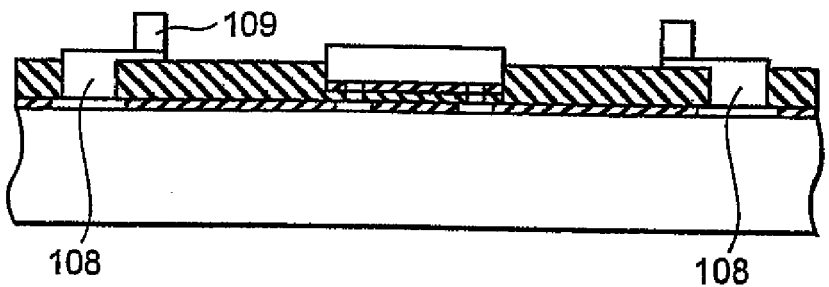

Thereafter, a plurality of the conductive wiring members 108 are formed on the insulating film 107 and in the openings 107A by an electroless plating method so as to be electrically coupled to the first electrodes 103 as shown in FIG. 5D. The conductive wiring members 108 are formed in each of the circuit element regions 501A of the substrate 501 so as to extend from peripheral sides of each of the circuit element regions 501A toward an inside of each of the circuit element regions 501A. Also, a plurality of the conductive post members 109 are formed on the conductive wiring members 108 so as to be electrically coupled to the conductive wiring members 108. The conductive post members 109 are formed inside the peripheral region of each of the circuit element regions 501A in which the first electrodes 103 are disposed.

Then, a resin layer 110 such as an epoxy resin layer is formed on the substrate 501 so as to cover the insulating film 107, the circuit element chips 102, the conductive wiring members 108 and the conductive post members 109. In this example, the resin layer 110 is formed by a transfer molding method. When the circuit element chips 102 are sealed with the resin layer 110, each of the circuit element chips 102 receive fluid pressure caused by resin inpouring. However, since the circuit element chips 102 are stably mounted on the substrate 501 by the insulating film 107 which fills the gaps between the circuit element chips 102 and the substrate 501 and covers the side surfaces of the circuit element chips 102, the circuit elements 102 may be suppressed from jolting out of alignment from the desired locations of the circuit element regions 501A.

Figure 5E:
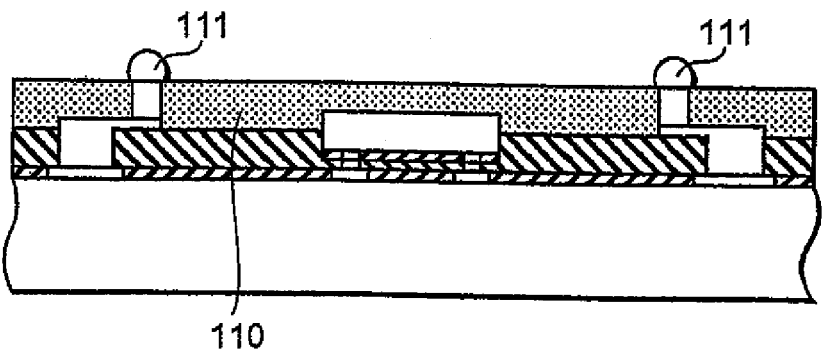

The resin layer 110 is removed by grinding so that top surfaces of the conductive post members 109 are exposed from the resin layer 110. As shown in FIG. 5E, a plurality of the external electrodes 111 are formed on the top surfaces of the conductive post members 109. The external electrodes 111 may be formed by a solder paste printing method. Alternatively, the external electrodes 111 may be solder balls. After forming the external electrodes 111, the substrate 501 is divided into individual semiconductor devices which respectively include each of the circuit element regions 501A and each of the circuit element chips 102. Hereupon, the substrate 501 is divided in accordance with the circuit element regions 501A. That is, the substrate 501 is divided along a plurality of lines which configure the circuit element regions 501A of the substrate 501. Thus, the outline size of each of the semiconductor devices 100 is substantially equal to the outline size of each of the circuit element regions 501A.

According to the first preferred embodiment, the insulating film is disposed between the first circuit element chip and the second circuit element chip and on the side surface of the second circuit element chip. Alternatively, after a circuit element chip is mounted on a substrate, the insulating film is formed on the substrate so that the gap between the substrate and the circuit element chip is filled with the insulating film. That is, the second circuit element chip is stably mounted on the first circuit element chip, or the circuit element chip is stably mounted on the substrate. Therefore, even when the second circuit element chip or the circuit element chip receives the fluid pressure caused by resin inpouring during the sealing process of the semiconductor device, the second circuit element chip or the circuit element chip may be suppressed from jolting out of alignment from the desired locations on the first circuit element chip or the substrate.

Figure 6:
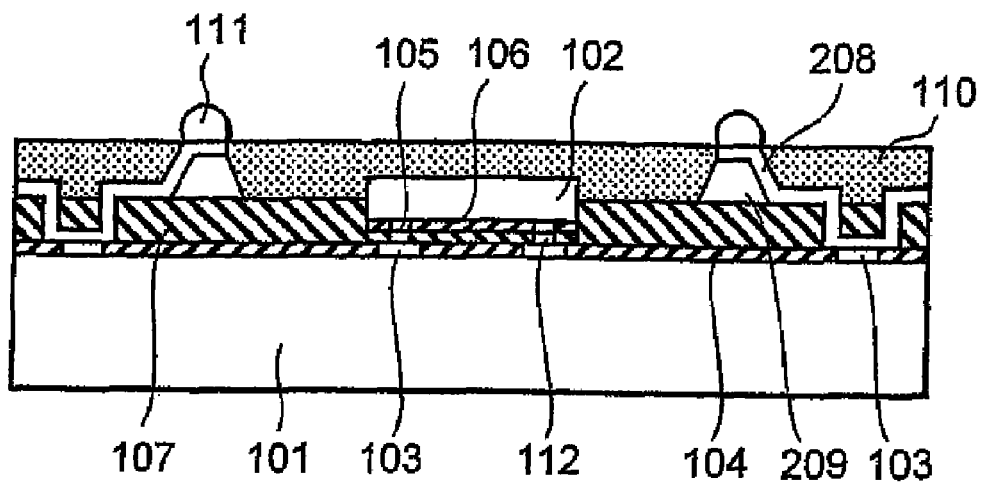
FIG. 6 is a cross-sectional view for describing the semiconductor device according to a second preferred embodiment of the present invention.

FIG. 6 is a cross-sectional view for describing the semiconductor device 200 according to a second preferred embodiment of the present invention. The semiconductor device 200 according to the second preferred embodiment has a plurality of conductive wiring members 208 which are different than the conductive wiring members 108 according to the first preferred embodiment. Furthermore, the semiconductor device 200 has a plurality of elastic protrusions 209. The other configurations of the semiconductor device according to the second preferred embodiment are the same as those according to the first preferred embodiment.

As shown in FIG. 6, the elastic protrusions 209 are disposed on the insulating film 107. The elastic protrusions 209 include insulating members such as polyimide resin, epoxy resin or silicon resin. A thickness of the elastic protrusion 209 depends upon the thickness of the resin layer 110. In this example, each of the elastic protrusion 209 has a thickness of approximately 100 μm. Also, the elastic protrusion 209 is formed by the spin coat method, a printing method or a laminating method. The conductive wiring members 208 are disposed from the first electrodes 103 onto top surfaces of the elastic protrusions 209 through the top surface of the insulating film 107 The external electrodes 111 are formed on the elastic protrusions 209 so as to be electrically coupled to the conductive wiring members 208.

According to the second preferred embodiment, the external electrodes are formed on the conductive wiring members which are disposed on the elastic protrusions. Therefore, in addition to the effects realized in the first preferred embodiment, the elastic protrusions absorb a pressure shock which arises when the semiconductor device is mounted on the external printed circuit board. That is, the pressure shock may be suppressed from applying to the first circuit chip element. As a result, the reliability with respect to electrical connection between the semiconductor device and the external printed circuit board may be improved. Also, with respect to the semiconductor device mounted on the external printed circuit board, the elastic protrusions may absorb thermal stresses between the semiconductor device and the external printed circuit board.

Figure 7:
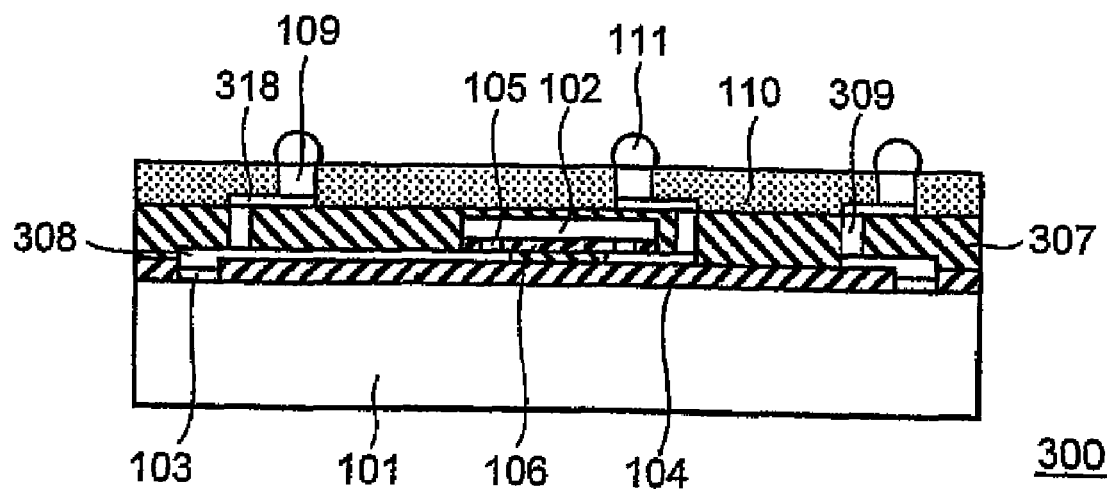
FIG. 7 is a cross-sectional view for describing the semiconductor device according to a third preferred embodiment of the present invention.

FIG. 7 is a cross-sectional view for describing the semiconductor device 300 according to a third preferred embodiment of the present invention. The semiconductor device 300 according to the third preferred embodiment includes a plurality of first conductive wiring members 308 and a plurality of second conductive wiring members 318 which are different than the conductive wiring members 108 according to the first preferred embodiment. Furthermore, the semiconductor device 300 includes a plurality of conductive post members 309 and an insulating film 307 which is different than the insulating film 107 according to the first preferred embodiment The other configurations of the semiconductor device according to the third preferred embodiment are the same as those according to the first preferred embodiment.

As shown in FIG. 7, the first conductive wiring members 308 are formed on the first protective film 104 by the electroless plating method, so as to extend from the first electrodes 103 toward the predetermined mounting region for the second circuit element chip 102. The second circuit element chip 102 is mounted on the first circuit element chip 101 so that the second electrodes 105 are electrically coupled to the first conductive wiring members 308. The insulating film 307 is formed on the first protective film 104 so as to cover the first conductive wiring members 308 and the second circuit element chip 102. As shown in FIG. 7, the insulating film 307 not only covers the first surface 102A and the side surfaces of the second circuit element chip 102 but also covers the second surface 102B of the second circuit element chip 102. Therefore, the second circuit element chip 102 is more stably mounted on the first circuit element chip 101. In addition, a height of the second surface 102B of the second circuit element chip 102 may be equal to a height of the upper surface of the insulating film 307 so that the second surface 102B of the second circuit element chip 102 is exposed from the insulating film 307. In this example, the insulating film 307 may include non-photosensitive polyimide resin. The insulating film 307 includes a plurality of openings so that portions of the first conductive wiring members 308 are exposed from the insulating film 307. The openings of the insulating film 307 are filled with a plurality of conductive members 309. A plurality of the second conductive wiring members 318 are formed on the insulating film 307 so as to be electrically coupled to the conductive members 309. The conductive post members 109 are disposed on the insulating film 307 so as to be electrically coupled to the second conductive wiring members 318. The resin layer 110 is formed on the insulating film 307 so as to cover the second conductive wiring members 318 and side surfaces of the conductive post members 109. A plurality of the external electrodes 111 are disposed on the conductive post members 109.

According to the third preferred embodiment, the semiconductor device has a plurality of the first conductive wiring members which electrically couples the first electrodes of the first circuit element chip to the second electrodes of the second circuit element chip. Therefore, in addition to the effects realized in the first preferred embodiment, the flexibility with respect to the mounting location of the second circuit element chip may be improved regardless of the arrangement of the first electrodes. Furthermore, the insulating film not only covers the first surface and the side surfaces of the second circuit element chip but also covers the second surface of the second circuit element chip. Therefore, the flexibility with respect to the arrangement of the second conductive wiring members may be improved. As a result, the flexibility with respect to the arrangement of the external electrodes may be improved.

What is claimed is:

1. A manufacturing method of a semiconductor device, comprising:
    providing a substrate which includes a circuit element region, wherein the circuit element region includes a plurality of first electrodes formed thereon;
    providing a circuit element chip which includes a first surface, wherein the first surface includes a plurality of second electrodes formed thereon;
    mounting the circuit element chip on the circuit element region of the substrate with a gap therebetween, the first surface of the circuit element chip facing the circuit element region;
    forming an insulating film between the substrate and the circuit element chip after said mounting, so that the gap between the substrate and the circuit element chip is filled with the insulating film; and
    forming a resin layer to cover the substrate, the circuit element chip and the insulating film.

2. The manufacturing method according to claim 1, further comprising:
    forming the insulating film on a side surface of the circuit element chip.

3. The manufacturing method according to claim 1, further comprising:
    forming a first protective film on the circuit element region that exposes the first electrodes; and
    forming a second protective film on the first surface of the circuit element chip that exposes the second electrodes,
    wherein said forming an insulating film includes disposing the insulating film between the first protective film and the second protective film, to contact both the first protective film and the second protective film.

4. The manufacturing method according to claim 1,
    wherein said providing a substrate includes providing a plurality of the circuit element regions,
    wherein said providing a circuit element chip includes providing a plurality of the circuit element chips,
    wherein said mounting the circuit element chip includes mounting the circuit element chips on the circuit element regions respectively,
    wherein said forming an insulating film includes forming the insulating film between the substrate and each of the circuit element chips, and
    wherein said forming a resin layer includes forming the resin layer to cover the circuit element chips.

5. The manufacturing method according to claim 4, further comprising:
    dividing the substrate covered by the resin layer into individual semiconductor devices which respectively include each of the circuit element regions and each of the circuit element chips.

* * * * *